United States Patent
Park et al.

(10) Patent No.: US 9,190,338 B2
(45) Date of Patent: Nov. 17, 2015

(54) SEMICONDUCTOR PACKAGE HAVING A HEAT SLUG AND A SPACER

(71) Applicant: SAMSUNG ELECTRONICS CO., LTD., Gyeonggi-do (KR)

(72) Inventors: Kyol Park, Daejeon (KR); Yunhyeok Im, Gyeonggi-do (KR); Eon Soo Jang, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/188,917

(22) Filed: Feb. 25, 2014

(65) Prior Publication Data

US 2014/0353813 A1  Dec. 4, 2014

(30) Foreign Application Priority Data

May 31, 2013  (KR) .................. 10-2013-0062865

(51) Int. Cl.
*H01L 23/34* (2006.01)
*H01L 23/16* (2006.01)
*H01L 23/31* (2006.01)
*H01L 23/427* (2006.01)
(Continued)

(52) U.S. Cl.
CPC ............. *H01L 23/16* (2013.01); *H01L 23/3128* (2013.01); *H01L 23/4275* (2013.01); *H01L 23/4334* (2013.01); *H01L 25/0657* (2013.01); *H01L 23/38* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC . H01L 23/34; H01L 25/0657; H01L 23/4334; H01L 23/4275; H01L 23/3128; H01L 23/16; H01L 2224/16225; H01L 2924/15311; H01L 23/38; H01L 2224/73204; H01L 2224/32225; H01L 2924/00
USPC ......... 257/686, 723, 777, 685, 737, 738, 778, 257/712, 713, 77, 710, 704, 708, 709, 71, 257/707, 675, 717, 720, 706, 705
See application file for complete search history.

(56) References Cited

U.S. PATENT DOCUMENTS 7,781,883 B2 * 8/2010 Sri-Jayantha et al. ........ 257/712
7,843,058 B2   11/2010 Tsao et al.
(Continued)

FOREIGN PATENT DOCUMENTS

KR  1020060004302  1/2006
KR  1020070012792  1/2007
(Continued)

*Primary Examiner* — Alexander Oscar Williams
(74) *Attorney, Agent, or Firm* — F. Chau & Associates, LLC (57) ABSTRACT

A semiconductor package includes a substrate. A lower semiconductor chip is disposed above the substrate. An upper semiconductor chip is disposed on the lower semiconductor chip. A top surface of the lower semiconductor chip at an end of the lower semiconductor chip is exposed. A heat slug disposed above the upper semiconductor chip. A molding layer is disposed between the substrate and the heat slug. The molding layer is configured to seal the lower semiconductor chip and the upper semiconductor chip. An upper spacer is disposed between the lower semiconductor chip and the heat slug. The upper spacer is disposed on the exposed surface of the lower semiconductor chip.

15 Claims, 10 Drawing Sheets

(51) Int. Cl.
    *H01L 23/433*     (2006.01)
    *H01L 25/065*     (2006.01)
    *H01L 23/38*     (2006.01)

(56) References Cited

U.S. PATENT DOCUMENTS

| | | | |
|---|---|---|---|
| 7,999,369 B2* | 8/2011 | Malhan et al. | 257/690 |
| 7,999,371 B1* | 8/2011 | Arcedera et al. | 257/706 |
| 8,212,352 B2 | 7/2012 | Pendse | |
| 8,415,788 B2* | 4/2013 | Li et al. | 257/723 |
| 2004/0125568 A1 | 7/2004 | Tao | |
| 2005/0184339 A1 | 8/2005 | Allen et al. | |
| 2006/0091517 A1 | 5/2006 | Yoo et al. | |
| 2006/0125087 A1* | 6/2006 | Colbert et al. | 257/706 |
| 2006/0175696 A1* | 8/2006 | Kim | 257/686 |
| 2006/0220225 A1* | 10/2006 | Ni et al. | 257/712 |
| 2007/0205495 A1 | 9/2007 | Fernandez et al. | |
| 2008/0237842 A1* | 10/2008 | Manepalli | 257/712 |
| 2009/0224400 A1* | 9/2009 | Rahman | 257/713 |
| 2012/0098118 A1 | 4/2012 | Lin et al. | |
| 2014/0327156 A1* | 11/2014 | Hwang | 257/777 |
| 2014/0339692 A1* | 11/2014 | Kim et al. | 257/713 |

FOREIGN PATENT DOCUMENTS

| | | |
|---|---|---|
| KR | 1020110076608 | 7/2011 |
| KR | 1020110077286 | 7/2011 |

\* cited by examiner

SEMICONDUCTOR PACKAGE HAVING A HEAT SLUG AND A SPACER

CROSS-REFERENCE TO RELATED APPLICATION

This U.S. non-provisional patent application claims priority under 35 U.S.C. §119 to Korean Patent Application No. 10-2013-0062865, filed on May 31, 2013, the disclosure of which is incorporated by reference herein in its entirety.

TECHNICAL FIELD

The present inventive concept relates to a semiconductor package, and more particularly, to a semiconductor package having a system-in-package (SIP) structure.

DISCUSSION OF RELATED ART

In the electronic industry, light, small, fast, and high-performance electronic products may be provided at a low price. Semiconductor packages are configured so that integrated circuits (ICs) may be used in the electronic products. However, as consumption power increases due to an increase in processing rate and capacitance, reliability of the semiconductor packages may be affected.

SUMMARY

Exemplary embodiments of the present inventive concept provide a semiconductor package with a system-in-package structure.

Exemplary embodiments of the present inventive concept provide semiconductor packages including a substrate. A lower semiconductor chip is disposed above the substrate. An upper semiconductor chip disposed on the lower semiconductor chip. Top surfaces of the lower semiconductor chip at opposite ends of the lower semiconductor chip are exposed. A heat slug is disposed above the upper semiconductor chip. A molding layer is disposed between the substrate and the heat slug. The molding layer is configured to seal the lower semiconductor chip and the upper semiconductor chip. Upper spacers are disposed between the lower semiconductor chip and the heat slug. The upper spacers are disposed on the exposed top surfaces of the lower semiconductor chip and the upper spacers include a material different from a material of the molding layer.

In exemplary embodiments of the present inventive concept, the lower semiconductor chip may include a first region corresponding to the upper semiconductor chip. The lower semiconductor chip may include a second region adjacent to the first region. The upper spacer may be disposed in a second region.

In exemplary embodiments of the present inventive concept, the upper semiconductor chip may have a bottom surface facing the upper semiconductor chip, a top surface facing the bottom surface, and a side surface connecting the top surface to the bottom surface. The upper spacer may be in contact with the side surface of the upper semiconductor chip.

In exemplary embodiments of the present inventive concept, the uppermost surface of the upper spacer may be at a same level as a top surface of the upper semiconductor chip.

In exemplary embodiments of the present inventive concept, a plane of the lower semiconductor chip may have a first long axis extending in a first direction. A plane of the upper semiconductor chip may have a second long axis extending in a second direction different from the first direction.

In exemplary embodiments of the present inventive concept, the upper spacer may include silicon or a metal.

In exemplary embodiments of the present inventive concept the upper spacer may include a thermal electric cooler.

In exemplary embodiments of the present inventive concept, the upper spacer may include a first spacer including a phase change material and a second spacer surrounding the first spacer. The second spacer may be configured to seal the first spacer.

In exemplary embodiments of the present inventive concept, the semiconductor package may include a lower spacer disposed between the substrate and the lower semiconductor chip. The lower spacer may include a material having thermal conductivity greater than that of the molding layer.

In exemplary embodiments of the present inventive concept, the lower semiconductor chip may have a first surface facing the heat slug. A second surface of the lower semiconductor chip may face the first surface. A third surface of the lower semiconductor chip may connect the first surface to the second surface. The lower spacer may be in contact with the third surface of the lower semiconductor chip.

In exemplary embodiments of the present inventive concept, a semiconductor package includes a substrate. A lower semiconductor chip is disposed above the substrate. An upper semiconductor chip is disposed on the lower semiconductor chip. A heat slug is disposed above the upper semiconductor chip. A molding layer is disposed between the substrate and heat slug. The molding layer is configured to seal the lower semiconductor chip and the upper semiconductor chip. A lower spacer is disposed between the substrate and the upper semiconductor chip. The lower spacer includes a material having thermal conductivity greater than a thermal conductivity of the molding layer. The upper semiconductor chip includes a lower semiconductor chip region. The lower semiconductor chip region is configured to overlap the lower semiconductor chip. A spacer region is configured to overlap the lower spacer.

In exemplary embodiments of the present inventive concept, the upper semiconductor chip may have a low surface facing the lower semiconductor chip. An upper surface of the upper semiconductor chip may face the lower surface. The lower semiconductor chip may be configured to expose bottom surfaces of the upper semiconductor chip at opposite ends of the upper semiconductor chip. The lower spacer may be disposed on the exposed bottom surfaces of the upper semiconductor chip.

In exemplary embodiments of the present inventive concept, the lower semiconductor chip may have a first surface facing the substrate. A second surface of the lower semiconductor chip may face the first surface. A third surface of the lower semiconductor chip may connect the first surface to the second surface. The lower spacer may be in contact with the third surface of the lower semiconductor chip.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Exemplary embodiments of the present inventive concept will now be described more fully hereinafter with reference to the accompanying drawings, in which some exemplary embodiments of the present inventive concept are shown. The present inventive concept may, however, be embodied in different forms and should not be construed as limited to the exemplary embodiments set forth herein. The terms of a singular form may include plural forms unless otherwise indicated.

It will also be understood that when a layer (or film) is referred to as being 'on' another layer or substrate, it can be directly on the other layer or substrate, or intervening layers may be present.

Like reference numerals may denote like elements in the specification and drawings.

Hereinafter, a semiconductor package according to exemplary embodiments of the present inventive concept will be described.

Figure 1:
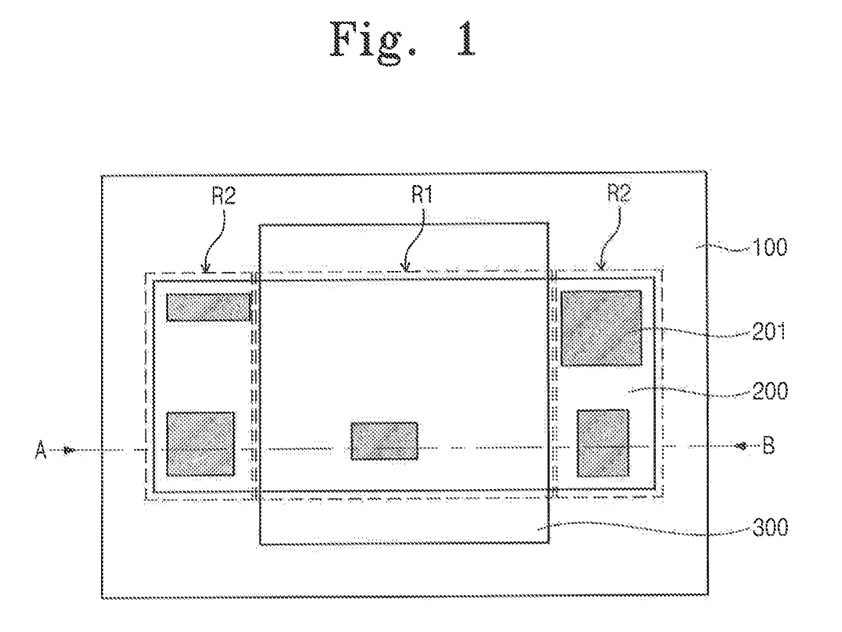
FIG. 1 is a plan view of a semiconductor package according to an exemplary embodiment of the present inventive concept.
Figure 2:
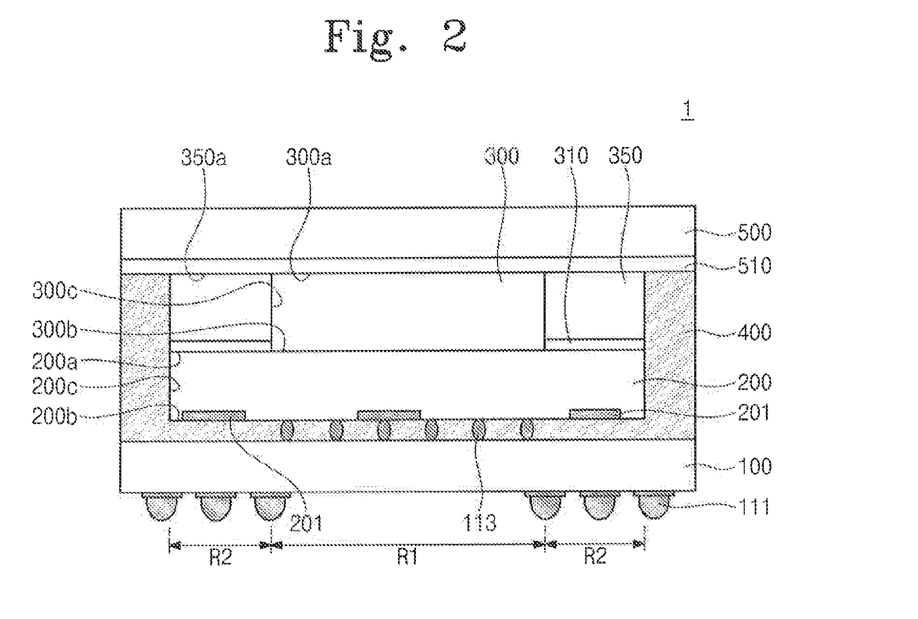
FIGS. 2 and 3 are cross-sectional views taken along line A-B of FIG.
Figure 3:
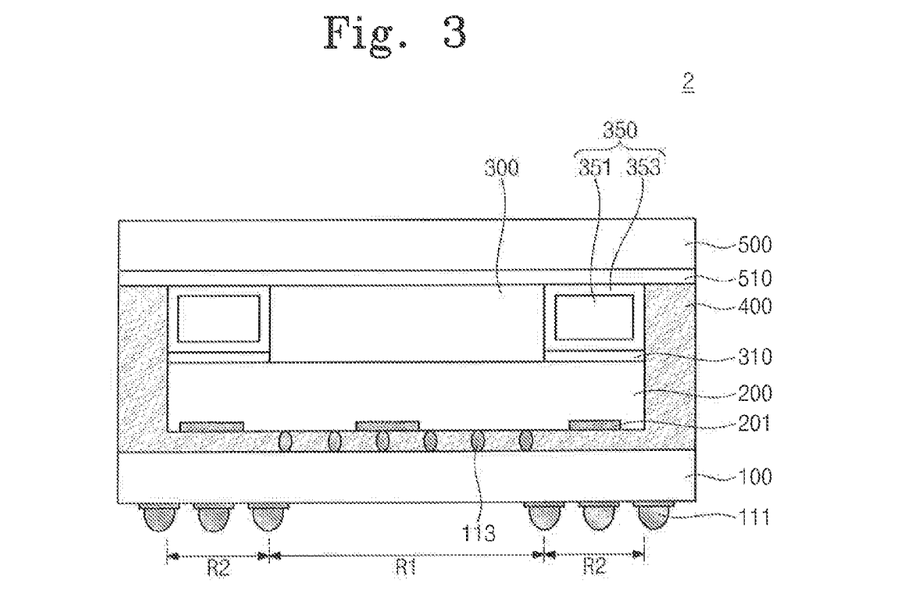

FIG. 1 is a plan view of a semiconductor package according to an exemplary embodiment of the present inventive concept. FIGS. 2 and 3 are cross-sectional views taken along line A-B of FIG. 1.

Referring to FIGS. 1 and 2, a semiconductor package 1 may include a substrate 100, a lower semiconductor chip 200, an upper semiconductor chip 300, a molding layer 400, and a heat slug 500.

The substrate 100 may be a printed circuit board (PCB). The PCB may include a circuit pattern. An external terminal 111 may be disposed on a bottom surface of the substrate 100. The external terminal 111 may include a conductive material and may have a solder ball shape. The external terminal 111 may electrically connect the lower semiconductor chip 200 and/or the upper semiconductor chip 300 to an external electrical device.

The lower semiconductor chip 200 may be disposed above the substrate 100. The lower semiconductor chip 200 may have a first surface 200a, a second surface 200b facing the first surface 200a, and a third surface 200c connecting the first surface 200a to the second surface 200b. Connecting terminals 113 may be disposed between the substrate 100 and the lower semiconductor chip 200. The connecting terminals 113 may electrically connect the lower semiconductor chip 200 to the substrate 100. Each of the connecting terminals 113 may include a conductive material and may have a solder ball or bump shape. The lower semiconductor chip 200 may be connected to the substrate 100 by a bonding wire. The lower semiconductor chip 200 may have a rectangular plane. The plane of the lower semiconductor chip 200 may have a first region R1 and a second region R2. The first region R1 may be a region in which the lower semiconductor chip 200 overlaps the upper semiconductor chip 300. The second region R2 may be provided on each end of the first region R1. The lower semiconductor chip 200 might not overlap the upper semiconductor chip 300 in the second region R2.

The lower semiconductor chip 200 may include an integrated circuit (IC), e.g., a memory circuit, a logic circuit, or a combination thereof. Heat sources 201 may be disposed in the lower semiconductor chip 200. The lower semiconductor chip 200 may include one or more heat sources 201. The heat sources 201 may be IP blocks such as, for example, a central processing unit (CPU), a memory interface, and a universal serial bus (USB). IP blocks may be blocks in which necessary functions are arranged into a hardware or software state to form the semiconductor IC. The heat sources 201 may be spaced apart from each other within the lower semiconductor chip 200. The spacing apart of the heat sources 201 may minimize electrical and/or thermal interference between the heat sources 201. For example, the heat sources 201 may be disposed on positions corresponding to a corner and/or edges of the lower semiconductor chip 200. A plurality of heat sources 201 may be disposed in the second region R2.

The upper semiconductor chip 300 may be disposed on the first surface 200a of the lower semiconductor chip 200. The upper semiconductor chip 300 may expose edges of the first surface 200a, e.g., opposite ends of the first surface 200a. The upper semiconductor chip 300 may be flip-chip mounted above the substrate 100, for example, by using a solder or a bump. The upper semiconductor chip 300 may be connected to the substrate 100. The upper semiconductor chip 300 may be connected to the substrate 100 by a bonding wire (not shown). The upper semiconductor chip 300 may include a bottom surface 300b facing the substrate 100, a top surface 300a facing the bottom surface 300b, and a side surface 300c connecting the bottom surface 300b to the top surface 300a. The upper semiconductor chip 300 may have a rectangular plane. The upper semiconductor chip 300 may be disposed in a first direction different from a second direction of the lower semiconductor chip 200. For example, as shown in FIG. 1, the lower semiconductor chip 200 may have a long axis extending in the first direction. The upper semiconductor chip 300 may have a long axis extending in the second direction that is different from the first direction. The upper semiconductor chip 300 may be misaligned with the lower semiconductor chip 200. The misalignment of the upper semiconductor chip 300 and the lower semiconductor chip 200 may define the first region R1 and the second region R2.

The upper semiconductor chip 300 may include an integrated circuit (IC), e.g., a memory circuit, a logic circuit, or a combination thereof. The upper semiconductor chip 300 may have a different configuration from the lower semiconductor chip 200. For example, the lower semiconductor chip 200 may include the logic circuit, and the upper semiconductor chip 300 may include the memory circuit. For example, the lower semiconductor chip 200 may manage and control an operation of the upper semiconductor chip 300. The upper semiconductor chip 300 may generate heat greater than a heat generated by the lower semiconductor chip 200.

The molding layer 400 may be disposed between the substrate 100 and the heat slug 500. The molding layer 400 may seal the lower semiconductor chip 200 and the upper semiconductor chip 300. The molding layer 400 may include an insulation polymer such as, for example, an epoxy molding compound.

The heat slug 500 may be disposed above the upper semiconductor chip 300. The heat slug 500 may include a material having low thermal resistance, e.g., a metal. A heat transfer layer 510 may be disposed between the upper semiconductor chip 300 and the heat slug 500. The heat transfer layer 510 may include an adhesive material and/or a thermal interface material (TIM). Heat generated from the upper semiconductor chip 300 may be transferred into the heat slug 500 through the heat transfer layer 510. Heat generated from the first region R1 of the lower semiconductor chip 200 may be transferred into the heat slug 500 through the upper semiconductor chip 300.

An upper spacer 350 may be disposed between the lower semiconductor chip 200 and the heat transfer layer 510. The upper spacer 350 may be provided in the second region R2. For example, the upper spacer 350 may be disposed on opposite ends of the first surface 200a of the lower semiconductor chip 200. An upper adhesion film 310 may be disposed between the lower semiconductor chip 200 and the upper spacer 350. The upper adhesion film 310 may attach the upper spacer 350 to the lower semiconductor chip 200. The upper spacer 350 may include a material having a thermal conductivity greater than a thermal conductivity of the molding layer 400. For example, the upper spacer 350 may include silicon and/or a metal. For example, the upper spacer 350 may include a thermal electric cooler (TEC). When the uppermost surface 350a of the upper spacer 350 has the same level as a top surface 300a of the upper semiconductor chip 300, the lower semiconductor chip 200 may be physically and/or thermally connected to the heat transfer layer 510. Heat generated from the second region R2 of the lower semiconductor chip 200 in which the plurality of heating sources 201 are distributed may be transferred into the heat slug 500 through the upper spacer 350. As a planar area of the upper spacer 350 is increased, heat generated from the lower semiconductor chip 200 may be transferred into the heat slug 500. In the semiconductor package 1 according to an exemplary embodiment of the present inventive concept, operation reliability of the lower semiconductor chip 200 including an upper spacer 350 may be increased. For example, the upper spacer 350 may be in contact with the side surface 300c of the upper semiconductor chip 300. The upper spacer 350 may physically and/or thermally connect the upper semiconductor chip 300 to the heat transfer layer 510.

Referring to FIGS. 1 and 3, a semiconductor package 2 may include a substrate 100, a lower semiconductor package 200, an upper semiconductor package 300, an upper spacer 350, a molding layer 400, a heat transfer layer 510, and a heat slug 500. The substrate 100, the lower semiconductor chip 200, the upper semiconductor chip 300, the molding layer 400, the heat transfer layer 510, and the heat slug 500 may be the same or similar to those of the above-described semiconductor package 1.

The upper spacer 350 may include a first upper spacer 351 and a second upper spacer 353. The first upper spacer 351 may be disposed in a position corresponding to a center of the upper spacer 350. The upper spacer 351 may include a phase change material. The phase change material contained in the first upper spacer 351 may vary its state within a predetermined temperature range, e.g., at an operation temperature of the lower semiconductor chip 200 and/or an operation temperature of the upper semiconductor chip 300 (e.g., at a temperature of from about 70° C. to about 80° C.). The first upper spacer 351 may absorb a larger amount of heat when the upper spacer 350 includes the phase change material compared to a case in which the upper spacer 350 does not contain the phase change material. A heat transfer efficiency of the lower semiconductor chip 200 and/or the upper semiconductor chip 300 may be increased. The second upper spacer 353 may surround the first upper spacer 351. The second spacer 353 may seal the first upper spacer 351. The second upper spacer 353 may have a rectangular shape, for example. The second upper spacer 353 may include a material having a conductivity higher than that of the molding layer 400, e.g., silicon or a metal.

Figure 4:
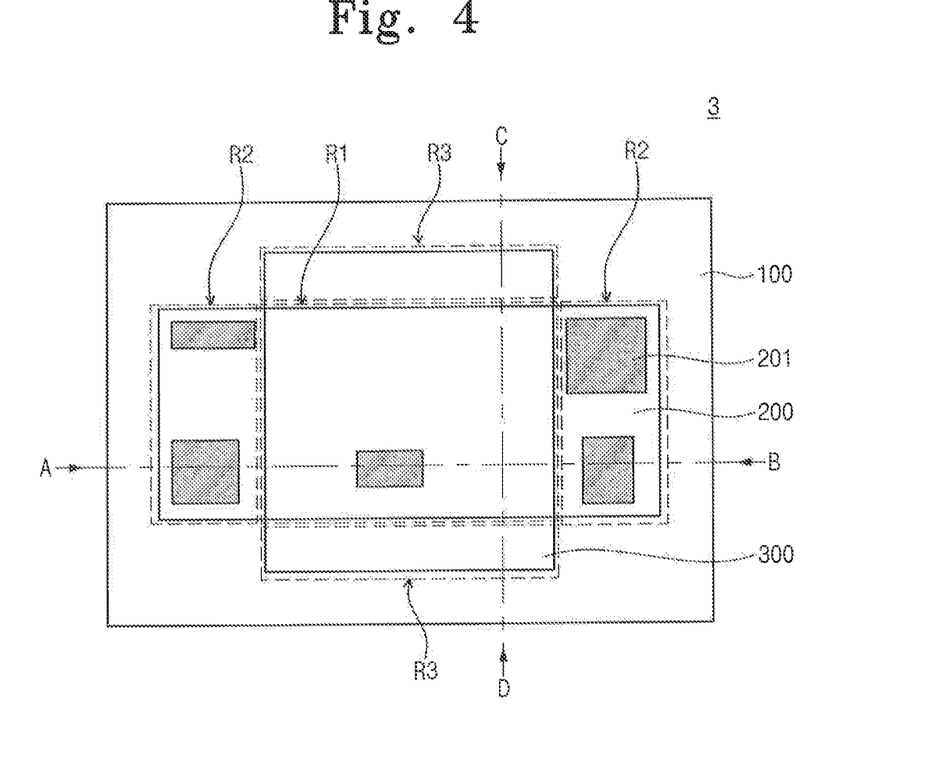
FIG. 4 is a plan view of a semiconductor package according to an exemplary embodiment of the present inventive concept.
Figure 5:
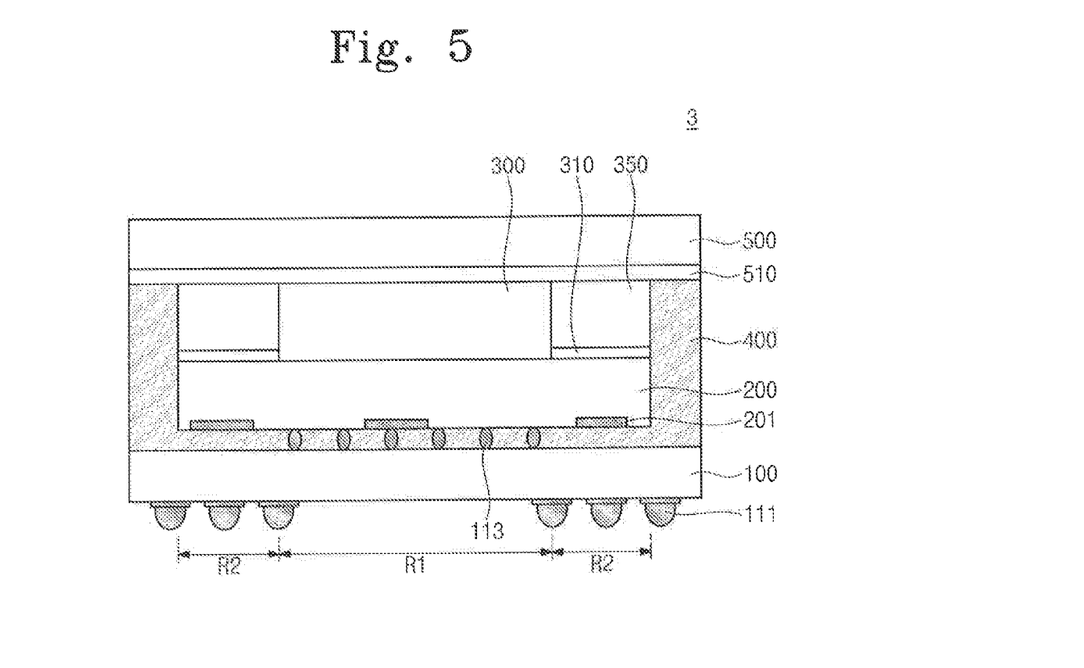
FIG. 5 is a cross-sectional view taken along line A-B of FIG. 4.
Figure 6:
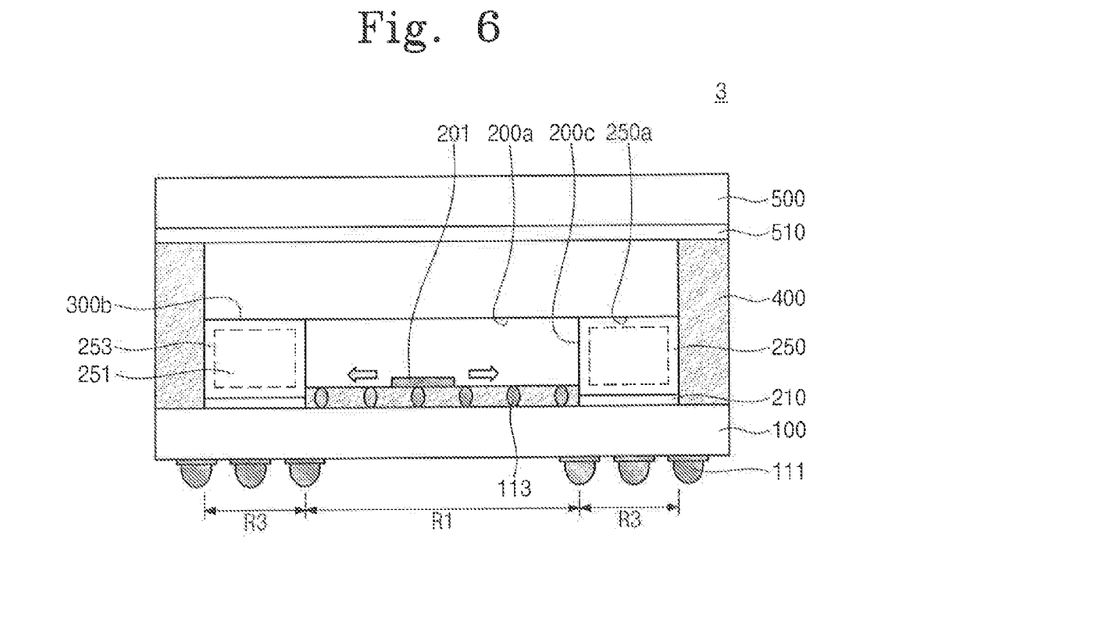
FIG. 6 is a cross-sectional view taken along line C-D of FIG. 4.

FIG. 4 is a plan view of a semiconductor device according to an exemplary embodiment of the present inventive concept. FIG. 5 is a cross-sectional view taken along line A-B of FIG. 4. FIG. 6 is a cross-sectional view taken along line C-D of FIG. 4.

Referring to FIGS. 4 to 6, a semiconductor package 3 may include a substrate 100, a lower semiconductor package 200, a lower spacer 250, an upper semiconductor chip 300, a molding layer 400, a heat transfer layer 510, and a heat slug 500. For example, an upper spacer 350 may be omitted.

The upper semiconductor chip 300 may have a different configuration from the lower semiconductor chip 200. For example, the lower semiconductor chip 200 may include a logic circuit, and the upper semiconductor chip 300 may include a memory circuit. For example, the lower semiconductor chip 200 may include the memory circuit, and the upper semiconductor chip 300 may include the logic circuit.

A plane of the lower semiconductor chip 200 may have a first region R1 and a second region R2. A plane of the upper semiconductor chip 300 may have the first region R1 and a third region R3. The upper semiconductor chip 300 may be disposed in a direction different from the direction of the lower semiconductor chip 200. The first region R1, the second region R2, and the third region R3 may be defined by the respective positions of the upper semiconductor chip 300 and the lower semiconductor chip 200. The upper semiconductor chip 300 may overlap the lower semiconductor chip 200 in the first region R1. The second region R2 and the third region R3 may be regions in which the upper semiconductor chip 300 does not overlap the lower semiconductor chip 200. The third region R3 may be provided at opposite ends of the first region R1. Planes of the first region R1, the second region R2, and/or the third region R3 may be arranged in a cross (+) shape. For example, the first region R1 may be disposed in a central portion, and the second region R2 may be spaced apart from the third region R3.

The lower spacer 250 may be disposed between the substrate 100 and the upper semiconductor chip 300. The uppermost surface 250a of the lower spacer 250 may be at a same level as a level of a first surface 200a of the lower semiconductor chip 200. A lower adhesion film 210 may be disposed between the substrate 100 and the lower spacer 250. The lower adhesion film 210 may attach the lower spacer 250 to the substrate 100. The lower semiconductor chip 200 may expose opposite ends of a bottom surface 300b of the upper semiconductor chip 300. The lower spacer 250 may be disposed on opposite ends of the bottom surface 300b. The lower spacer 250 may include a material having thermal conductivity greater than a thermal conductivity of the molding layer 400, as in the above-described example of the upper spacer 350. For example, the lower spacer 250 may include silicon and/or a metal. For example, the lower spacer 250 may include a TEC. For example, the lower spacer 250, as depicted with a dotted line in FIG. 6, may include a first lower spacer 251 and a second lower spacer 253. The first lower spacer 251 and the second lower spacer 253 may be the same or similar to the first upper spacer 351 and the second upper spacer 353 which are described above with reference to FIG. 3.

For example, the lower spacer 250 may be in contact with a third surface 200c of the lower semiconductor chip 200. The lower spacer 250 may function as a thermal passage for the lower semiconductor chip 200. For example, the lower spacer 250 may transfer heat generated from the lower semiconductor chip 200 into the upper semiconductor chip 300. For example, the lower spacer 250 may transfer heat generated from the third region R3 of the upper semiconductor chip 300 into the substrate 100. In the semiconductor package 3, operation reliability of the lower semiconductor chip 200 and/or the upper semiconductor chip 300 including the lower spacer 250 may be increased.

Hereinafter, a method for manufacturing a semiconductor package according to exemplary embodiments of the present inventive concept will be described.

Figure 7:
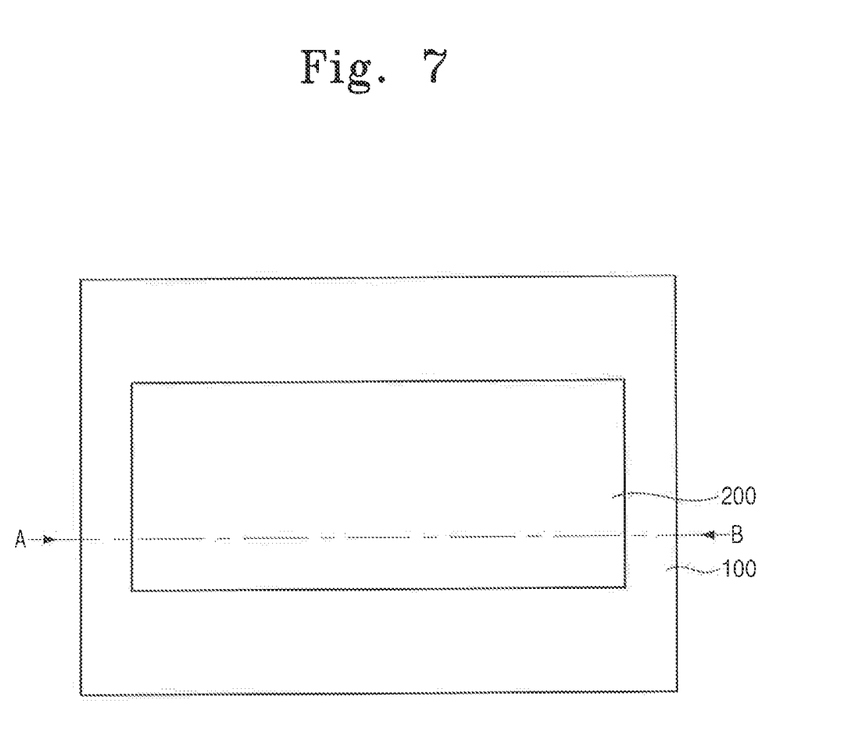
FIGS. 7 to 10 are plan views and cross-sectional views illustrating a method for manufacturing a semiconductor package according to an exemplary embodiment of the present inventive concept.
Figure 8:
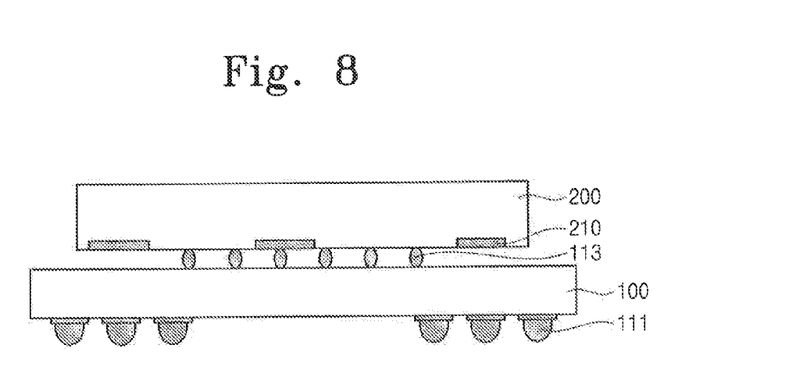
Figure 9:
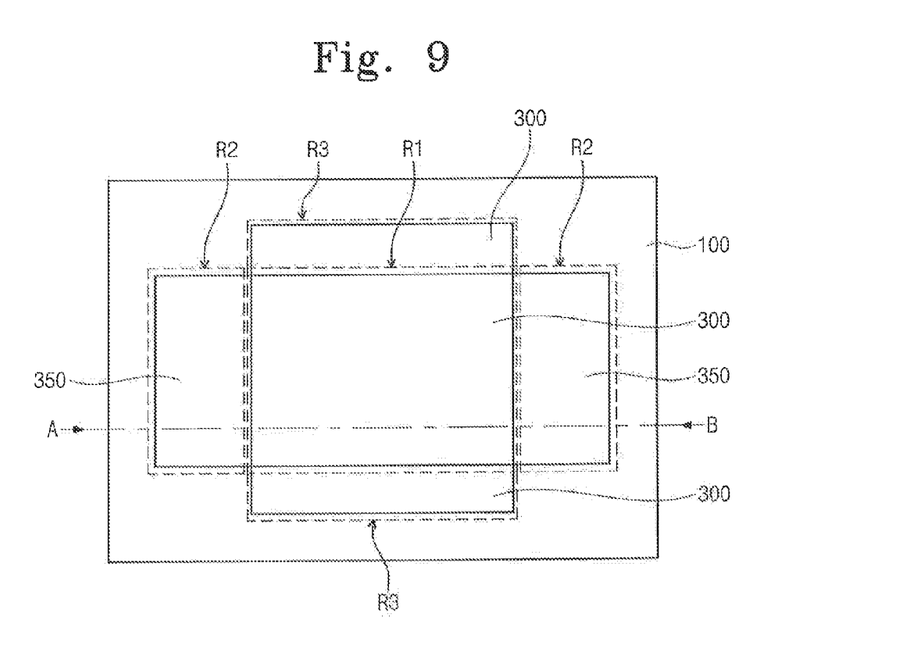
Figure 10:
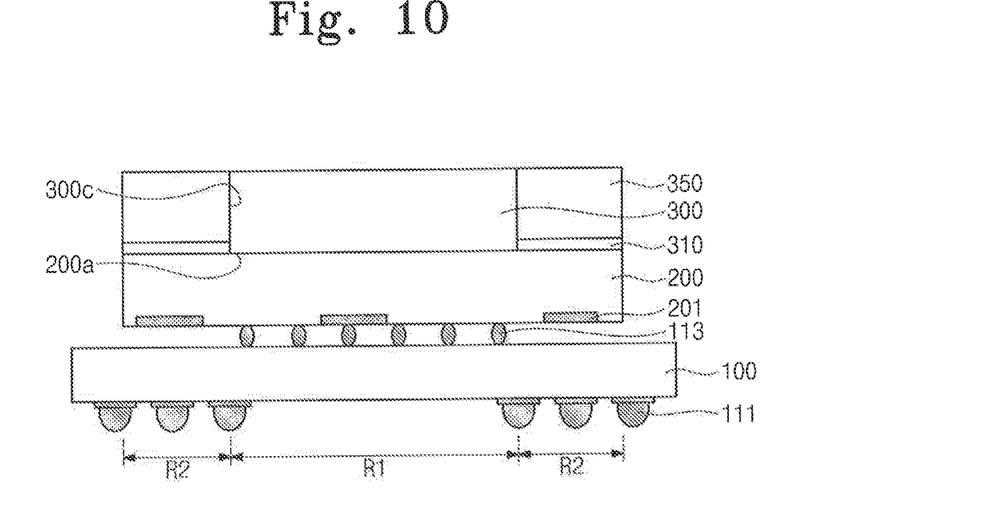

FIGS. 7 to 10 are plan views and cross-sectional views illustrating a method for manufacturing a semiconductor package according to an embodiment of the inventive concept. FIGS. 8 and 10 are cross-sectional views taken along line A-B of FIGS. 7 and 9, respectively. Hereinafter, redundant explanations may be omitted.

Referring to FIGS. 7 and 8, a lower semiconductor chip 200 may be disposed above a substrate 100. The substrate 100 may include an external terminal 111 and the substrate 100 and the external terminal 111 may be the same or similar to those described above with reference to FIG. 1. Connecting terminals 113 may be disposed between the substrate 100 and the lower semiconductor chip 200. The connecting terminals 113 may electrically connect the lower semiconductor chip 200 to the substrate 100. The lower semiconductor chip 200 may be connected to the substrate 100 using a bonding wire (not shown).

Referring to FIGS. 9 and 10, an upper semiconductor chip 300 and an upper spacer 350 may be disposed on the lower semiconductor chip 200. The upper semiconductor chip 300 may be offset with respect to the lower semiconductor chip 200. The position of the upper semiconductor chip 300 may expose opposite ends of a first surface 200a of the lower semiconductor chip 200. A first region R1 and a second region R2 may be defined. An upper spacer 350 may be disposed on opposite ends of the exposed first surface 200a. For example, an upper adhesion film 310 may be disposed on opposite ends of the first surface 200a. The upper adhesion film 310 may attach the upper spacer 350 to the lower semiconductor chip 200. The upper spacer 350 may be in contact with a side surface 300c of the upper semiconductor chip 300. The upper semiconductor chip 300 may be provided in a first region R1 and a third region R3. The upper spacer 350 may be provided in the second region R2. The exemplary embodiment of the present inventive concept is not limited to the described order for forming the upper semiconductor chip 300 and the upper spacer 350.

Referring again to FIGS. 1 and 2, the molding layer 400, the heat transfer layer 510, and the heat slug 500 may be disposed on the substrate 100. The molding layer 400, the heat transfer layer 510, and the heat slug 500 may be the same or similar to those described with reference to FIG. 1. An epoxy molding compound may be filled into the substrate 100 to form the molding layer 400. The molding layer 400 may be at a same level as a level of the top surface 300a of the upper semiconductor chip 300 and the uppermost surface 350a of the upper spacer 350. The molding layer 400 may be formed between the connecting terminals 113. The heat transfer layer 510 may be formed to cover the upper semiconductor chip 300 and the upper spacer 350. The heat slug 500 may include a material having low thermal resistance, e.g., a metal. The heat slug 500 may be disposed on the heat transfer layer 510.

Figure 11:
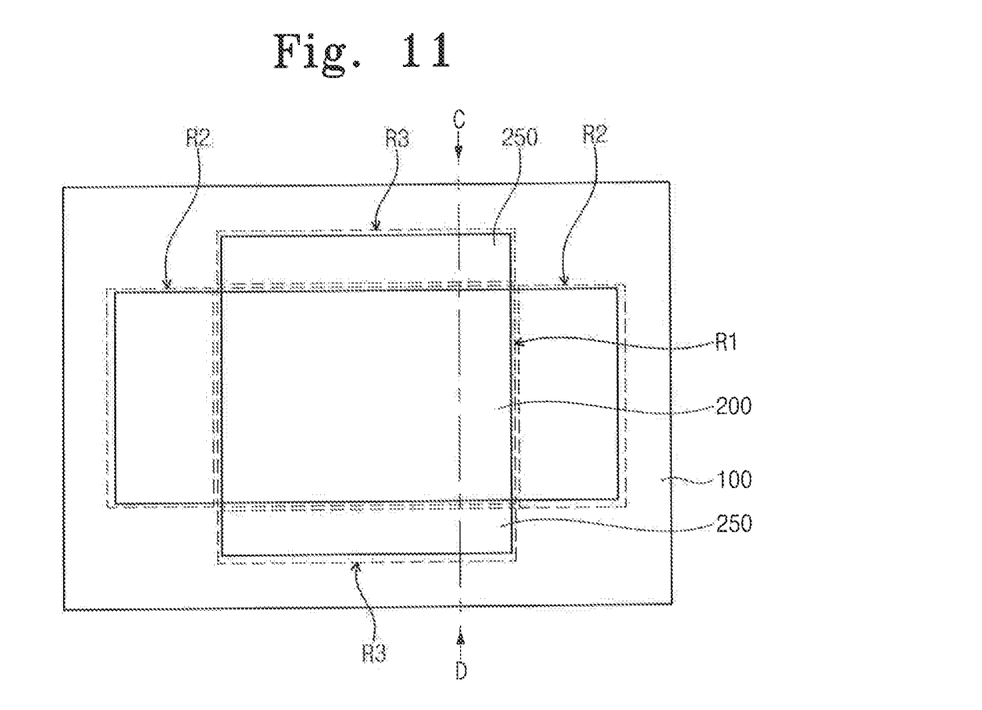
FIGS. 11 to 14 are plan views and cross-sectional views illustrating a method for manufacturing a semiconductor package according to an exemplary embodiment of the present inventive concept.
Figure 12:
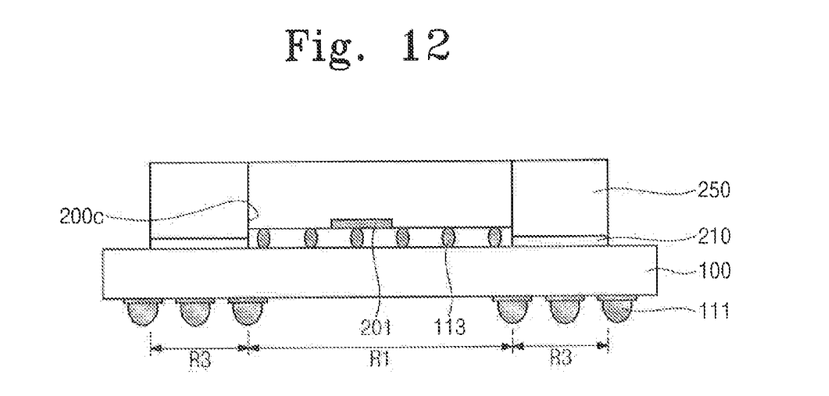
Figure 13:
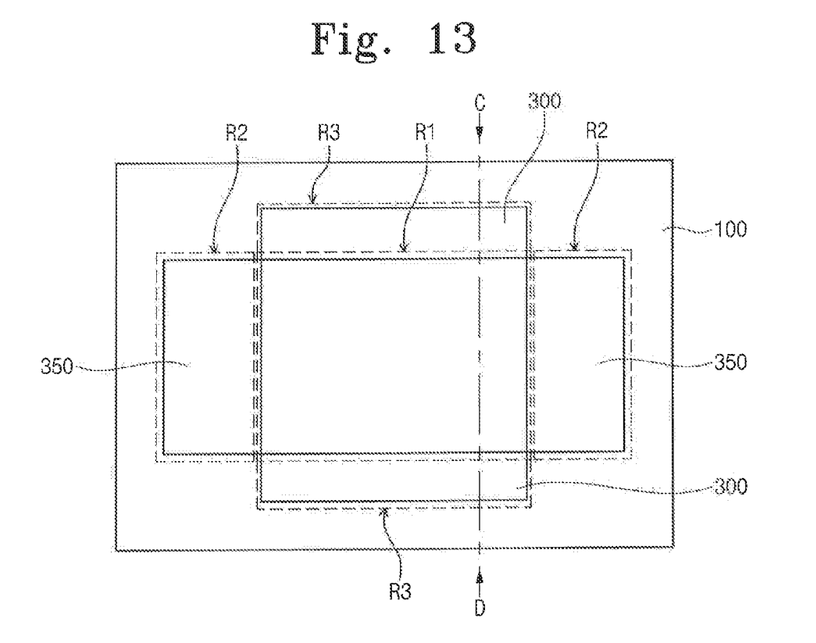
Figure 14:
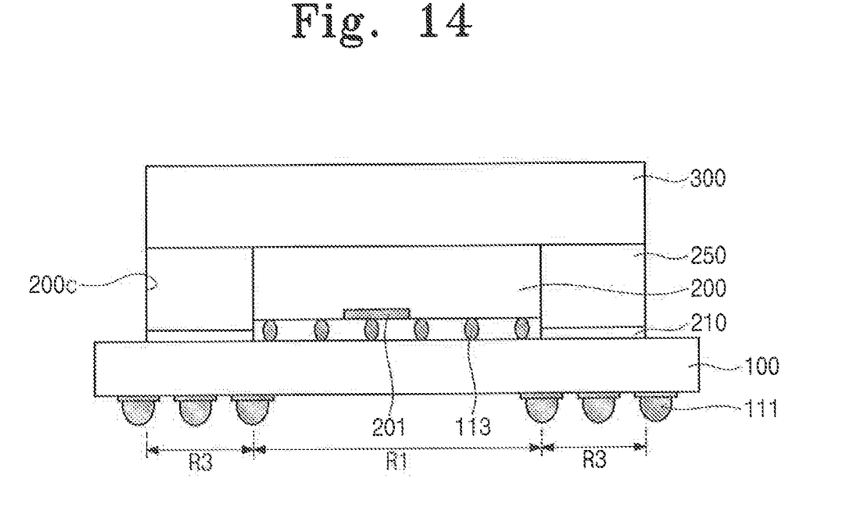

FIGS. 11 to 14 are plan views and cross-sectional views illustrating a method for manufacturing a semiconductor package according to another embodiment of the inventive concept. FIGS. 12 and 14 are cross-sectional views taken along line C-D of FIGS. 11 and 13, respectively. Hereinafter, redundant explanations may be omitted.

Referring to FIGS. 11 and 12, a lower semiconductor chip 200 and a lower spacer 250 may be disposed above a substrate 100. The lower semiconductor chip 200 may be disposed in a first region R and a second region R2. The lower spacer 250 may be disposed in a third region R3. The lower semiconductor chip 200 may be formed using a method that is the same as or similar to the exemplary method described above with reference to FIGS. 7 and 8. The lower spacer 250 may be attached to the substrate 100 by a lower adhesion film 210. The lower spacer 250 may be in contact with a third surface 200c of the lower semiconductor chip 200.

Referring to FIGS. 13 and 14, an upper semiconductor chip 300 may be disposed on the lower semiconductor chip 200. The upper semiconductor chip 300 may be provided in a first region R1 and a third region R3. The upper semiconductor chip 300 may cover the lower spacer 250. The upper semiconductor chip 300 may be formed using a method equal that is the same as or similar to the exemplary method described above with reference to FIGS. 9 and 10. An upper spacer 350 may be formed on the lower semiconductor chip 200. The upper spacer 350 may be omitted.

Referring to FIGS. 3 to 6, the molding layer 400, the heat transfer layer 510, and the heat slug 500 may be formed on the substrate 100. The molding layer 400, the heat transfer layer 510, and the heat slug 500 may be formed using a method that is the same as or similar to the exemplary methods described above.

The semiconductor package according to exemplary embodiments of the present inventive concept may include the upper spacer 350. The upper spacer 350 may transfer the heat generated from the lower semiconductor chip 200 into the heat slug 500. The upper spacer 350 may be in contact with the side surface 300c of the upper semiconductor chip 300. The upper spacer 350 may transfer heat generated by the upper semiconductor chip 300 into the heat slug 500. The lower spacer 250 may be disposed between the substrate 100 and the upper semiconductor chip 300. In other words, heat dissipation characteristics of the semiconductor package may be increased. The operation reliability of the semiconductor package may be increased.

Figure 15:
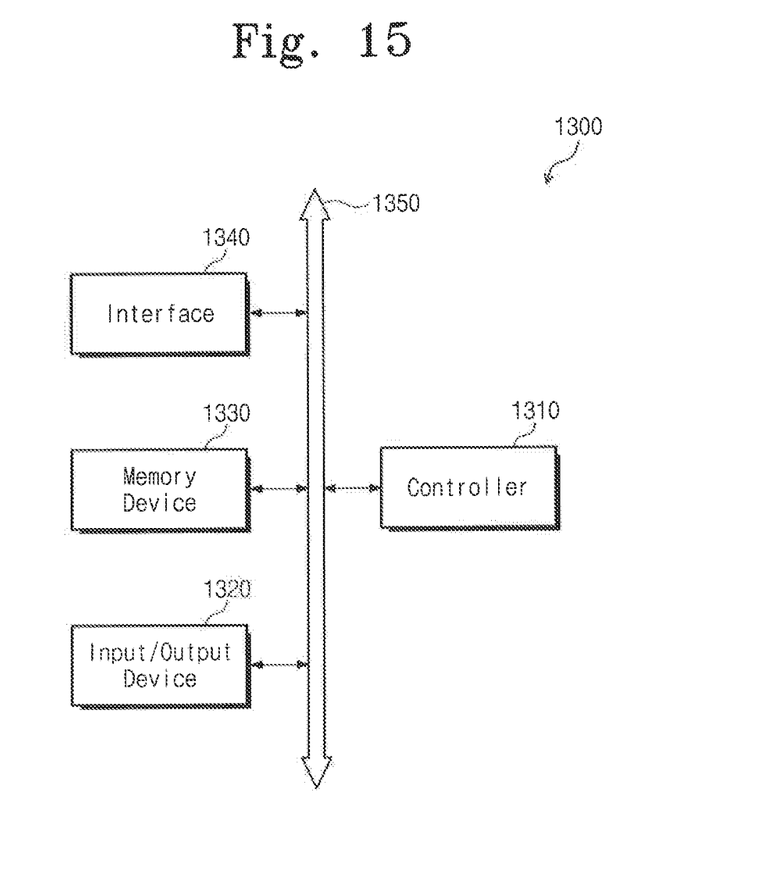
FIG. 15 is a block diagram illustrating an electronic device including a semiconductor package according to exemplary embodiments of the present inventive concept.
Figure 16:
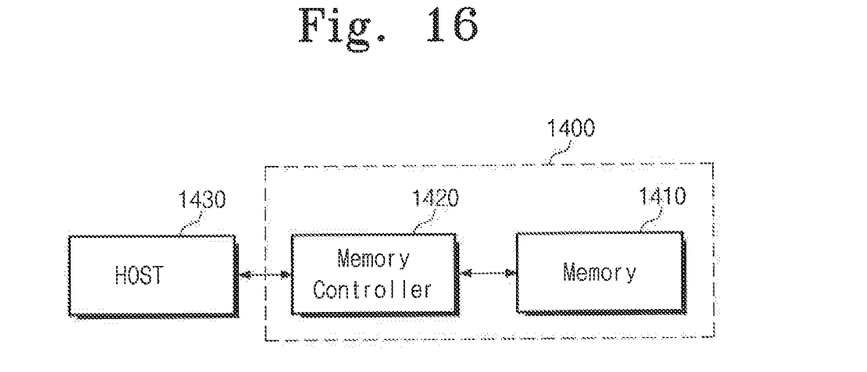
FIG. 16 is a block diagram illustrating a memory system including a semiconductor package according to exemplary embodiments of the present inventive concept.

FIG. 15 is a block diagram illustrating an example of an electronic device including a semiconductor package according to exemplary embodiments of the present inventive concept. FIG. 16 is a block diagram illustrating a memory system including a semiconductor package according to exemplary embodiments of the present inventive concept.

Referring to FIG. 15, an electronic system 1300 may include a controller 1310, an input/output device 1320, and a memory device 1330. The controller 1310, the input/output device 1320, and the memory device 1330 may be connected through a bus 1350. The bus 1350 may be a passage through which data passes. For example, the controller 1310 may include at least one microprocessor, digital signal processor, microcontroller, and/or a logic device performing equivalent functions thereof. The controller 1310 and the memory device 1330 may include one or more of the semiconductor packages 1, 2, and/or 3 according to exemplary embodiments of the present inventive concept. The input/output device 1320 may include one or more of a keypad, a keyboard, and/or a display device. The memory device 1330 may store the data. The memory device 1330 may store the data and/or commands executed by the controller 1310. The memory device 1330 may include a volatile memory device and/or a non-volatile memory device. The memory device 1330 may be configured using flash memory. For example, the flash memory according to an exemplary embodiment of the present inventive concept may be mounted on an information processing system such as a mobile device or a desktop computer. The flash memory may include a solid state drive (SSD). An electronic system 1300 may stably store a high capacity data in a flash memory system. The electronic system 1300 may include an interface 1340. The interface 1340 may transmit data to a communication network or may receive data from a communication network. The interface 1340 may operate wirelessly or by a cable. For example, the interface 1340 may include an antenna or a wire/wireless transceiver. The electronic system 1300 may include an application chipset, and a camera image processor (CIS), for example.

The electronic system 1300 may include a mobile system, a personal computer, an industrial computer, and/or a logic system configured to perform desired functions. For example, the mobile system may be a personal digital assistant (PDA), a portable computer, a web tablet, a mobile phone, a wireless phone, a laptop computer, a memory card, a digital music system, or an information transmitting/receiving system. When the electronic system 1300 is a device for wireless communication, it may use a communication interface protocol of a third generation communication system such as, for example, code division multiple access (CDMA), global system for mobile communications (GSM), north American digital cellular (NADC), enhanced-time division multiple access (E-TDMA), wideband code division multiple access (W-CDMA), and/or CDMA2000.

Referring to FIG. 16, a memory card 1400 may include a memory 1410 (e.g. a non-volatile memory device or a flash memory device) and/or a memory controller 1420. The memory 1410 and the memory controller 1420 may store data and/or read the stored data. The memory 1410 may include, for example, one of the semiconductor packages 1, 2, or 3 according to exemplary embodiments of the present inventive concept. The memory controller 1420 may read the stored data or may control memory 1410. The memory controller 1420 may signal the memory 1410 to store data in response to a read/write request from a host.

While the inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A semiconductor package, comprising:
    a substrate;
    a lower semiconductor chip disposed above the substrate;
    an upper semiconductor chip disposed on the lower semiconductor chip, wherein a surface of the lower semiconductor chip at an end of the lower semiconductor chip is exposed;
    a heat slug disposed above the upper semiconductor chip;
    a molding layer disposed between the substrate and the heat slug, wherein the molding layer is configured to seal the lower semiconductor chip and the upper semiconductor chip; and
    an upper spacer disposed between the lower semiconductor chip and the heat slug, wherein the upper spacer comprises a first upper spacer and a second upper spacer surrounding the first upper spacer, and
    wherein the upper spacer is disposed on the exposed surface of the lower semiconductor chip and the upper spacer includes a material different from a material of the molding layer.

2. The semiconductor package of claim 1, wherein the lower semiconductor chip includes a first region overlapping the upper semiconductor chip, and
    a second region adjacent to the first region,
    wherein the upper spacer is disposed on the second region.

3. The semiconductor package of claim 1, wherein the upper semiconductor chip has a bottom surface, a top surface facing the bottom surface, and a side surface connecting the top surface to the bottom surface, and
    wherein the upper spacer is in contact with the side surface of the upper semiconductor chip.

4. The semiconductor package of claim 1, wherein an uppermost surface of the upper spacer is at a same level as a top surface of the upper semiconductor chip.

5. The semiconductor package of claim 1, wherein a plane of the lower semiconductor chip has a long axis extending in a first direction, and
    a plane of the upper semiconductor chip has a long axis extending in a second direction.

6. The semiconductor package of claim 1, wherein the upper spacer comprises silicon or a metal.

7. The semiconductor package of claim 1, wherein the upper spacer comprises a thermal electric cooler.

8. The semiconductor package of claim 1, Wherein the first spacer includes a phase change material, and
    wherein the second spacer is configured to seal the first spacer.

9. A semiconductor package, comprising:
    a substrate comprising connecting terminals;
    a first semiconductor chip disposed on the connecting terminals, wherein the first semiconductor chip comprises a first region at a center of the first semiconductor chip and second regions disposed adjacent to the first region at ends of the first semiconductor chip, and wherein the first semiconductor chip comprises one or more heat sources;
    a second semiconductor chip disposed on the first region of the first semiconductor chip; and
    first and second spacers disposed on the second regions of the first semiconductor chip, wherein the first and second spacers each comprise a first upper spacer and a second upper spacer surrounding the first upper spacer.

10. The semiconductor package of claim 9, wherein the first upper spacer includes a phase change material and the second upper spacer includes silicon or a metal.

11. The semiconductor package of claim 9, wherein the first upper spacer is configured to absorb more heat than the second upper spacer.

12. The semiconductor package of claim 9, further comprising a heat transfer layer disposed on the second semiconductor chip.

13. The semiconductor package of claim 9, further comprising a heat transfer layer disposed on the second semiconductor chip and a heat slug disposed on the heat transfer layer.

14. The semiconductor package of claim 9, further comprising an adhesion film disposed between the first and second spacers and the first semiconductor chip.

15. The semiconductor package of claim 9, further comprising one or more external connection terminals disposed below the substrate.

\* \* \* \* \*